United States Patent [19]

Yamamoto et al.

[11] Patent Number: 5,047,370
[45] Date of Patent: Sep. 10, 1991

[54] METHOD FOR PRODUCING COMPOUND SEMICONDUCTOR SINGLE CRYSTAL SUBSTRATES

[75] Inventors: Hiromasa Yamamoto; Masayuki Mori; Osamu Oda, all of Toda, Japan

[73] Assignee: Nippon Mining Co., Ltd., Tokyo, Japan

[21] Appl. No.: 547,915

[22] Filed: Jul. 3, 1990

Related U.S. Application Data

[63] Continuation-in-part of Ser. No. 429,778, Oct. 30, 1989, abandoned.

[30] Foreign Application Priority Data

Oct. 31, 1988 [JP] Japan .................................. 63-276630
Jan. 15, 1989 [JP] Japan .................................. 1-153481

[51] Int. Cl.$^5$ .................................................. H01L 21/324
[52] U.S. Cl. ............................................. 437/248; 437/22; 437/247; 437/939; 437/946; 148/DIG. 65
[58] Field of Search ............... 437/248, 247, 939, 946, 437/923, 22; 148/DIG. 21, DIG. 65

[56] References Cited

U.S. PATENT DOCUMENTS

| 4,157,497 | 6/1979 | Eisen et al. | 437/22 |
| 4,357,180 | 11/1982 | Molnar | 437/22 |
| 4,636,280 | 1/1987 | Nakai et al. | 437/248 |
| 4,713,354 | 12/1987 | Egawa et al. | 437/22 |
| 4,752,592 | 6/1988 | Tamura et al. | 437/22 |
| 4,851,358 | 7/1989 | Huber | 437/248 |
| 4,889,493 | 12/1989 | Otsuki et al. | 437/248 |

FOREIGN PATENT DOCUMENTS

| 0073673 | 6/1977 | Japan | 437/22 |
| 2137524 | 10/1984 | United Kingdom | 437/248 |

Primary Examiner—Brian E. Hearn
Assistant Examiner—Trung Dang
Attorney, Agent, or Firm—McAulay Fisher Nissen Goldberg & Kiel

[57] ABSTRACT

A method for producing compound semiconductor single crystal substrates which comprises the following steps, wafers of a compound semiconductor single crystal grown by the LEC method are installed in an evacuated and sealed quartz ampoule and subjected to a first annealing step at the predetermined temperature for the predetermined period, then the wafers are gradually cooled down to room temperature at the predetermined cooling speed, the cooled wafers are then subjected to etching, the etched wafers are subjected to a second annealing step at the predetermined temperature for the predetermined period in a non-oxidizing atmosphere, and finally, the wafers are gradually cooled down to room temperature.

19 Claims, 4 Drawing Sheets

METHOD FOR PRODUCING COMPOUND SEMICONDUCTOR SINGLE CRYSTAL SUBSTRATES

This application is a continuation-in-part of Ser. No. 07/429,778 filed on Oct. 30, 1989, now abandoned.

BACKGROUND OF THE INVENTION

1. Field of the Invention

The present invention relates to a method for producing compound semiconductor single crystal substrates adapted for semiconductor devices. More particularly, the present invention relates to a method available for growing III-V group compound semiconductor single crystals such as GaAs, GaP, InAs, InP and so on, and a method for heat-treating the grown compound semiconductor single crystals.

2. Description of the Prior Art

Various methods for producing compound semiconductor single crystals are well known. For example, a seed crystal is immersed in the melted solution of the crystal in a crucible and then the seed crystal is pulled up being rotated relatively to the crucible to grow the single crystal from the seed crystal. As an alternative method, the melted solution is gradually solidified to grow the single crystal. In industrial scale, Liquid Encapsulated Czochralski Method (LEC Method) which belongs to the former method, and Gradient Freeze Method (GF Method), Horizontal Bridgeman Method (HB Method), and Vertical Bridgeman Method (VB Method), belongs to the latter method and all are well known.

Although these single crystal growth methods each is a little different from each other, it is possible to grow crystals with a basically similar process that the temperature gradient between the crystal and the melted solution is formed to solidify gradually the melted solution.

In the process, while the interface between the liquid and the solid where the crystal is grown is kept at its melting point, the crystal part already grown is kept at lower temperatures than the melting point. Accordingly, these single crystal growth methods do not avoid producing single crystals whose properties are inhomogeneous.

Therefore, if the wafers cut from the compound semiconductor single crystals grown by the above described methods are used for the substrates of electronic devices, the yield in such electronic device manufactures will become poor because of the variations in electrical properties across the wafer. For example, even though the wafers cut from undoped or Cr-doped GaAs single crystals have been used as the substrates for specific electronic devices such as ion-implanted type FETs, the above described variations across the wafer will cause variations in threshold voltage Vth of many FETs formed on the wafer.

Conventionally, in order to reduce the variation in the electrical properties across the wafer, Rumsby has provided the method, named "ingot annealing method" for annealing the single crystal ingot in an evacuated quartz ampoule at a high temperature from 620° to 1000° C. Refer to "D. Rumsby, R. M. Ware, B. Smith, M. Tyjberg, M. R. Brozel and E. J. Foulkes GaAs IC Symposium, Phoenix, Technical Digest (1983)34–37". Thereafter, various ingot annealing methods have been provided such as Japanese Patent Application Laid-Open Publications No. 61-201700, No. 61-222999, No. 62-21699, No. 62-21800, and No. 62-162700.

While such conventional ingot annealing methods can reduce the variations of resistivity and mobility across the wafer and therefore a homogeneous photoluminescence image can be obtained across the wafer, the wafer produced by such methods can not sufficiently reduce the variation in the threshold voltage, $V_{th}$, across the wafer used as the substrates for FETs.

The inventors of the present invention have attempted various heat-treatments and have taken note of a cathodoluminescence image which can be easily measured by a scanning electron microscope combined with a reflector and a photodetector. Since the cathodoluminescence image can be obtained with a higher resolution of 0.5 to 1 $\mu$m in comparison with a photoluminescence image with a resolution of 10 to 100 $\mu$m, the cathodoluminescence image can make clear the inhomogeneity of the wafers which are even homogeneous by observing photoluminescence images. GaAs single crystal has been often studied for a long time through its cathodoluminescence image. These studies reported that none of GaAs single crystals could provide uniform cathodoluminescence images. The inventors have also carried out measurements to determine the cathodoluminescence image on variously heat-treated single crystals in conventional manners. According to these measurements, some crystals could not provide completely uniform cathodoluminescence images. The inhomogeneity of a cathodoluminescence image can be caused by impurities and/or native defects such as EL2 inhomogeneously distributed in the crystal. This inhomogeneous distribution would result in variations in the threshold voltage Vth of FETs.

As one conventional method, an ingot of the single crystal has been annealed by two steps. This two step annealing method has however been proven that it has a demerit, that the density of microscopic defects; i.e., egg shape etch pits, revealed in the single crystal by AB etchant (Abrahams and Buiocchi etchant: 2lm $H_2O + 8$ mg $AgNO_3 + 1$ g $CrO_3 + 1$ mlHF) is always high. Then the inventors have studied the relationship between the microscopic defect density revealed by AB etchant and FET properties. They found the fact that the threshold voltage, Vth, of FETs fluctuates so much that the threshold voltage can not be controlled within a specific voltage range when the microscopic defects are observed under the gate of the FETs.

As a result, the conventional heat-treatments after the single crystal growth step can not produce the crystal wafers possessing a uniform cathodoluminescence image and less microscopic defects revealed by the AB etchant. This will cause poor properties of the electronic devices formed on the wafers, and thus the yield in the electronic device manufacturing process will be decreased.

BRIEF SUMMARY OF THE INVENTION

It is the primary object of the present invention to provide a method for producing compound semiconductor single crystal substrates possessing a uniform cathodoluminescence image and less microscopic defects revealed by the AB etchant.

To accomplish the above object, the method for producing compound semiconductor single crystal substrates comprises the following steps. Wafers of a grown compound semiconductor single crystal are installed in an evacuated and sealed quartz ampoule and subjected to a first annealing step at temperatures higher than 1100° C. and lower than the melting point of the single crystal for at least 30 minutes. Then the wafers are gradually cooled down to room temperature at a cooling rate from 1° to 30° C./min. The cooled wafers are subjected to etching. The etched wafers are subjected to a second annealing step at temperatures from 750° C. to 1100° C. for at least 20 minutes in a non-oxidizing atmosphere. Finally, the wafers are gradually cooled down to room temperature.

Preferably, the wafers to be used in this producing method are cut from the single crystals which are grown by a pulling-up technique in which the single crystals are grown by applying the vapor pressure of a high dissociation pressure element into an inner container set in a high pressure chamber, and whose microscopic defect density revealed by AB etchant is less than $2 \times 10^5$ cm$^{-2}$.

In the method according to the present invention, the cooling rate after the first annealing step is limited to between 1° and 30° C./min because a uniform cathodoluminescence image can not be formed when the cooling rate is less than 1° C./min and on the contrary slip lines causing the increment of dislocation density are generated in the single crystal when the cooling rate is greater than 30° C./min. The temperature range from 900° C. to 1000° C. for the second annealing step is most preferable. The annealing period is preferably at least 1 hour. Further, the second annealing step is preferably carried out in a non-oxidizing atmosphere such as nitrogen gas, hydrogen gas, AsH$_3$ gas, inert gas for example Ar gas, or a vacuum.

In the method according to the present invention, while the cooling process at the cooling rate from 1° C./min to 30° C./min after the first annealing step can reduce the microscopic defects revealed by AB etchant, the wafers possessing the uniform cathodoluminescence image can not be achieved only by employing the first annealing step and the cooling process. Therefore the wafers are subjected to etching, the second annealing step, and the cooling process to room temperature. These processes ensure the production of wafers possessing less microscopic defects revealed by AB etchant and the uniform cathodoluminescence image.

In the method according to the present invention, the first and second annealing steps require the single crystals in their wafer shape to produce the wafers possessing less microscopic defects and the uniform cathodoluminescence image. For example, the single crystal in an ingot shape subjected to the first annealing step can not be possessed of the required properties even if the wafers cut from the crystal ingot are subjected to the second annealing step.

The above and other related objects and features of the invention will be apparent from a reading of the following description of the disclosure found in the accompanying drawings and the novelty thereof pointed out in the appended claims.

DESCRIPTION OF THE PREFERRED EMBODIMENTS

1. First Embodiment

Figure 1A:
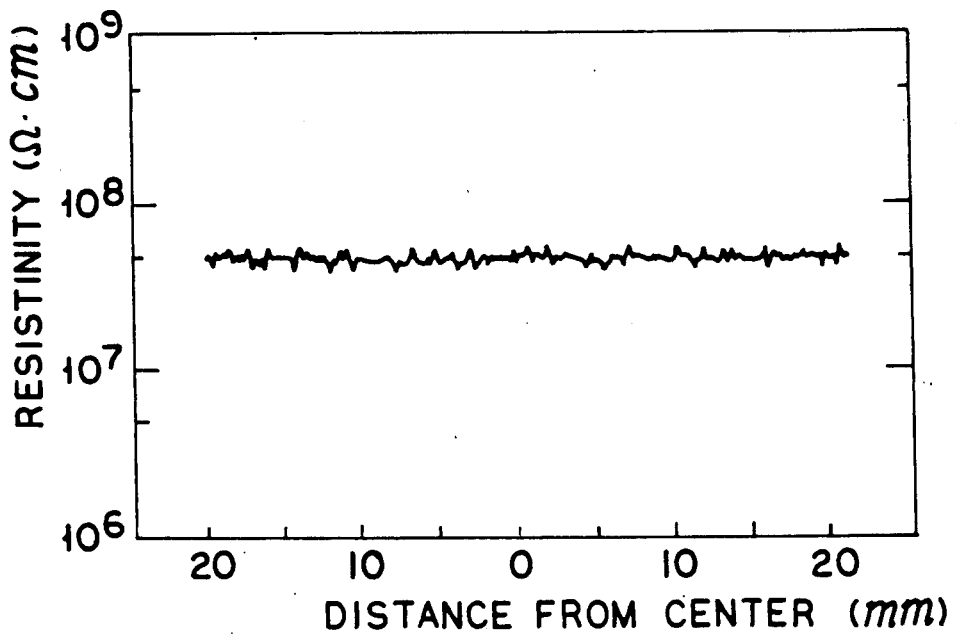
FIGS. 1(a) to 1(d) are graphs showing respective distributions of resistivity in the wafers, wherein FIG. 1(a) corresponds to the wafer resulting from a first embodiment according to the present invention, FIG. 1(b) corresponds to the wafer resulting from a second embodiment according to the present invention, FIG. 1(c) corresponds to the wafer resulting from a comparative example 1, and FIG. 1(d) corresponds to the wafer resulting from a comparative example 2.
Figure 1B:
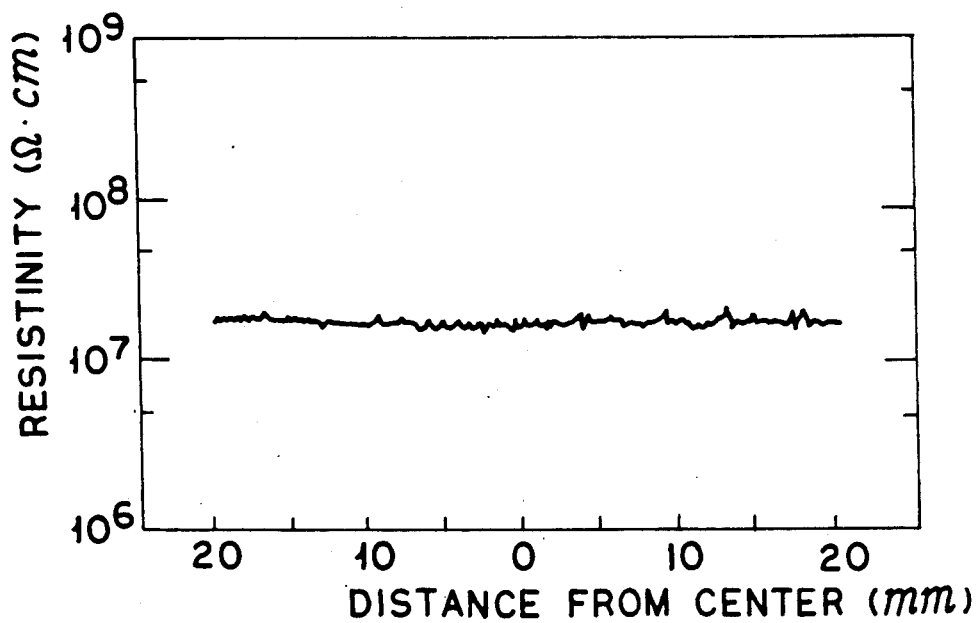
Figure 1C:
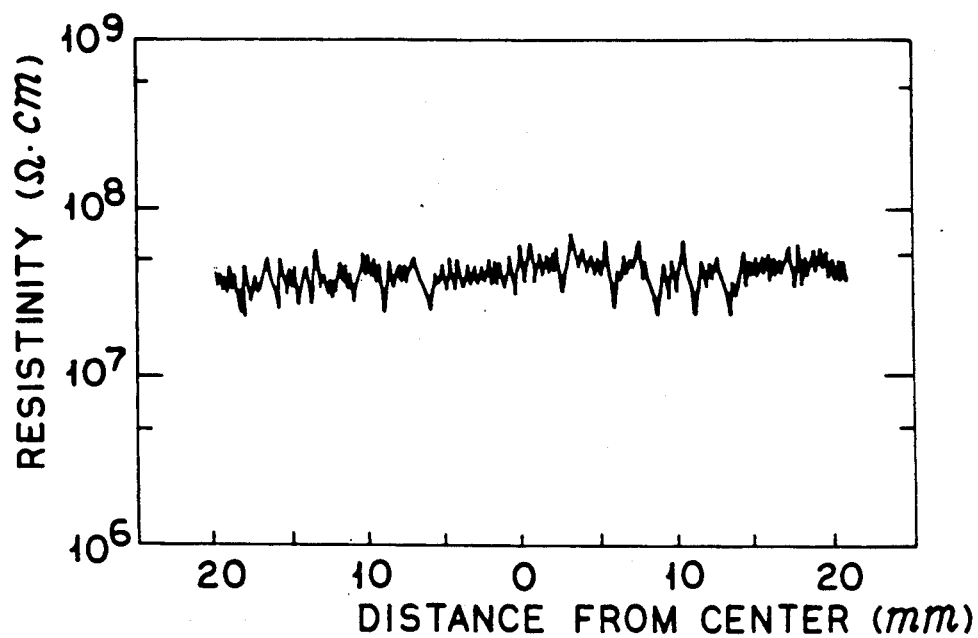
Figure 1D:
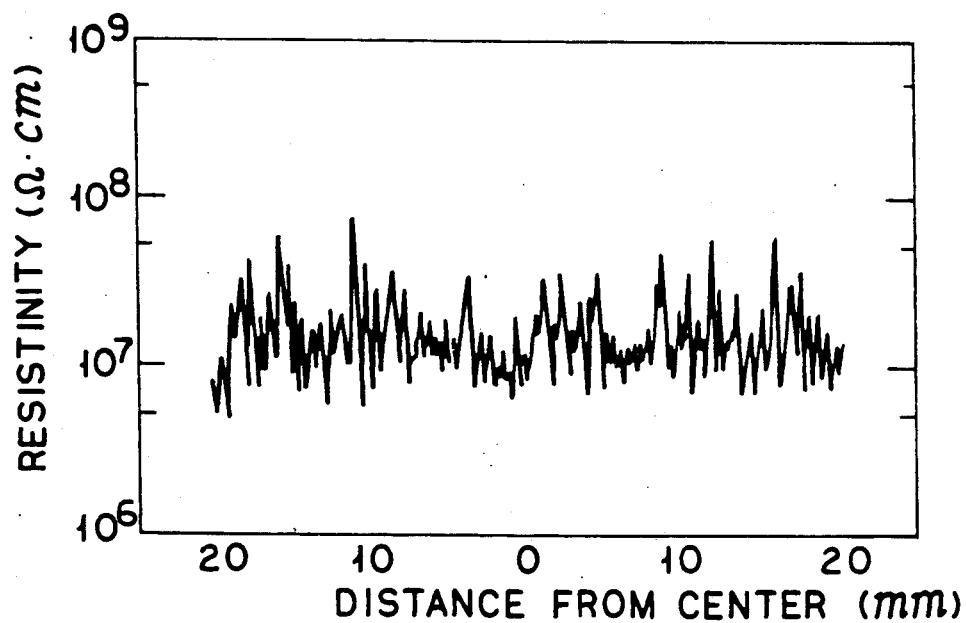

An undoped semi-insulating GaAs single crystal having diameter of 55 mm and a length along its straight body of 120 mm was grown by the LEC method. Both ends of this single crystal were cut and cylindrically shaped to form orientation flats. The single crystal was cut into wafers. The wafers were installed in a container made of Teflon, quartz, or a commercially produced etching apparatus, containing an etchant which was essentially composed of NaOH 25 g, H$_2$O$_2$ 100 cc, and H$_2$O 2000 cc. This etching was performed by moving the wafers or stirring the etchant. This etching treatment was carried out for 20 minutes to etch both surfaces of each of the wafers to remove soils from the wafer surfaces soiled by cutting work. After the etching step, the wafers were cleaned four times with water for 5 minutes, each cleaning was done in a supersonic cleaning machine and dried by blowing with N$_2$ gas at room temperature. 60 pieces of the wafers were installed in each quartz ampoule which was evacuated and sealed. This quartz ampoule was set in a furnace.

As a first annealing step, the quartz ampoule was subjected to heat-treatment at 1150° C. for 5 hours. In order to prevent the wafers from thermal decomposition, arsenic gas was supplied into the quartz ampoule up to arsenic pressure of 1 atm at 1150° C. After the first annealing step, the quartz ampoule was cooled down to room temperature at a cooling rate of 20° C./min. The cooled wafers were taken out of the quartz ampoule and optionally subjected to a decreasing step using a supersonic cleaning machine with solvents; acetone for 2 minutes, trichloroethylene for 2 minutes, acetone for 2 minutes, and water for 5 minutes (twice). This degreasing step may be omitted.

Then, the wafers were installed in a container made of Teflon, or quartz or a commercially produced etching apparatus, containing an etchant which was essentially composed of NaOH 25 g, H$_2$O$_2$ 100 cc, and H$_2$O 2000 cc. This etching was performed by moving the wafers or stirring the etchant. This etching treatment was carried out for 20 minutes to etch both surfaces of each of the wafers to remove arsenic deposited on and soils attached on the wafer surfaces. In addition to the above etchant, the following compositions can be also used as the etchant for this etching process.

$H_2SO_4:H_2O_2:H_2O$ Volume ratio from 1:1:1 to 10:1:1     (1)

$H Cl:H_2O_2:H_2O$ Volume ratio from 1:1:1 to 10:1:1     (2)

Br$_2$:methanol Volume ratio of Br$_2$ is from 0.5 to 10%   (3)

H$_3$PO$_4$:H$_2$O$_2$:H$_2$O Volume ratio from 1:1:1 to 10:1:1   (4)

NH$_4$OH:H$_2$O$_2$:H$_2$O Volume ratio from 1:1:1 to 10:1:1   (5)

After the etching step, the wafers were cleaned four times with water for 5 minutes for each cleaning in a supersonic cleaning machine and dried by blowing N$_2$ gas at room temperature.

At a second annealing step, the wafers were subjected to heat-treatment at a temperature of 950° C. for 10 hours in a nitrogen gas atmosphere. After the second annealing, they were cooled down to room temperature at a cooling rate of 20° C./min. The cooled quartz ampoule was taken out of the furnace.

2. Second Embodiment

The same samples as the first embodiment were subjected to the first annealing step and the etching step under the same condition as the first embodiment. They were cooled down to room temperature at a cooling rate of 3° C./min and cleaned. They were also subjected to the second annealing step under the same condition as the first embodiment. After the second annealing, they were cooled down to room temperature at a cooling speed 20° C./min.

3. Third Embodiment

Figure 3:
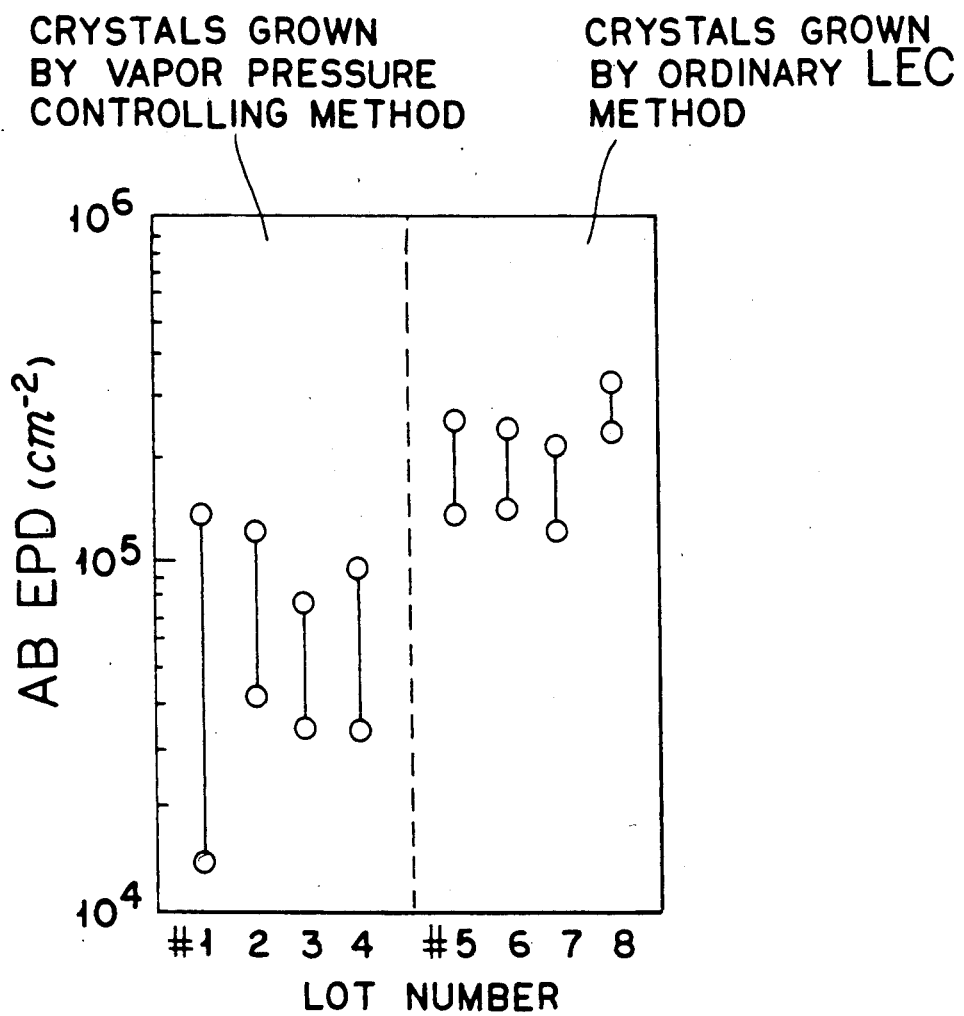
FIG. 3 is a graph showing the measured data of microscopic defect density revealed by AB etchant on respective GaAs single crystals produced by a vapor pressure controlled method and a conventional LEC method.

For the third embodiment, GaAs single crystals, diameter 3 inchs, were grown by a pulling-up technique using a vapor pressure control single crystal growth instrument which employs a high pressure chamber. An inner container included in the high pressure chamber was supplied with a high dissociation pressure element for applying the vapor pressure. The grown crystals had no surface dissociation at all. The grown crystals (lot numbers #1 to #4) were etched by AB etchant and the density of microscopic defects were measured. The measured data are shown in FIG. 3. The density was within the range from $2 \times 10^4$ to $5 \times 10^5$ cm$^{-2}$ which is remarkably lower than the density ranging from $2 \times 10^5$ to $5 \times 10^5$ cm$^{-2}$ of conventional crystals (lot numbers #5 to #8) grown by LEC method.

Next, both ends of each crystal were cut. The crystals were ground into a cylindrical shape and cut into wafers. Further the wafers were etched in the same manner as the first embodiment. They were installed in a quartz ampoule accompanied with arsenic for applying the vapor pressure. The ampoule was evacuated and sealed, and the wafers were annealed at 1150° C. for 5 hours. After this annealing step, they were cooled down to room temperature at a cooling rate of 20° C./min. The cooled wafers were taken out of the ampoule and etched. The etched wafers were annealed at 900° C. for 10 hours in flowing nitrogen gas.

COMPARATIVE EXAMPLE 1

The same single crystal as the first embodiment was grown by a commonly used LEC method. Both ends of the single crystal were 40 mm. These blocks were installed in a quartz ampoule. The quartz ampoule was set in a furnace.

At a first annealing step, the quartz ampoule was subjected to heat-treatment at 1150° C. for 5 hours. After the first annealing step, the quartz ampoule was cooled down to room temperature at a cooling rate of 20° C./min. The cooled blocks were cut into wafers with each wafer having a thickness of 0.75 mm. The wafers were respectively etched in the same manner as the first embodiment and cleaned. At a second annealing step, the wafers were subjected to heat-treatment at 950° C. for 10 hours in a nitrogen gas atmosphere. After the second annealing, they were cooled down to room temperature at a cooling rate of 20° C./min. The cooled quartz ampoule was taken out of the furnace.

COMPARATIVE EXAMPLE 2

An as-grown single crystal without any annealing was cut into wafers to be used as the comparative example 2.

The wafers produced by the above first and second embodiments, and the comparative examples 1 and 2 were subjected to a mirror-surface polishing process in an ordinary process. Various properties of these were measured. The resulting data are shown in the following table.

TABLE

|  | Embodiment 1 | Embodiment 2 | Embodiment 3 | Comp. Ex 1 | Comp. Ex 2 |
| --- | --- | --- | --- | --- | --- |
| Resistivity Variation across the Wafer (%) | 2 to 9 | 2 to 10 | 2 to 9 | 10 to 20 | 50 to 80 |
| Mobility Variation across the Wafer (%) | 1 to 4 | 1 to 5 | 1 to 4 | 5 to 10 | 10 to 25 |
| EPD by AB etchant (cm$^{-2}$) | 100 to 800 | 100 to 1500 | 50 to 200 | (1 to 8) $\times 10^4$ | (0.5 to 5) $\times 10^5$ |
| Cathodo-Luminescence Image | uniform | uniform | uniform | uniform | not uniform |
| Variations in Vth of FET (%) | 8 to 15 | 8 to 15 | 6 to 10 | 30 to 50 | 50 to 120 |

In the above Table, the resistivities were measured by a three electrode guard method at intervals of 100 μm across the wafer. The variations in the resistivity across the wafer were calculated from the following equation (1).

$$\frac{\text{Standard Deviation}}{\text{Mean}} \times 100 \qquad (1)$$

The mobilities were measured by the Van der Pauw method at intervals of 5 mm across the wafer. The variations in the mobilities were calculated from the following equation (2).

$$\frac{\text{Standard Deviation}}{\text{Mean}} \times 100 \qquad (2)$$

The microscopic defect densities were measured by an optical microscope after etching by AB etchant for 5 minutes at room temperature.

To measure the threshold voltage, Vth, of FETs, FETs were fabricated on each of the wafers prepared by various manners of the following process. The wafers were implanted with Si ions under the condition of 100 KeV and the dose of $2 \times 10^{12}$/cm$^2$. Further Si$_3$N$_4$ layers were deposited on the wafers and the wafers were subjected to a cap annealing at 830° C. for 10 minutes in a N$_2$ gas atmosphere to form activated layers.

Then gate electrodes and source and drain electrodes were formed on the activated layers. Au-Ge/Ni/Au as the source and drain electrodes and Ti/Pt/Au as the gate electrodes were used. For each FET, the gate electrode had a length of 2 μm and width of 5μm, and the distance between the source electrode and the drain electrode was 6 μm. FETs were formed at intervals of 200 μm.

Figure 2A:
FIG. 2(a) is a photograph showing the cathodoluminescence image resulting from the wafer produced by the first embodiment.
Figure 2B:
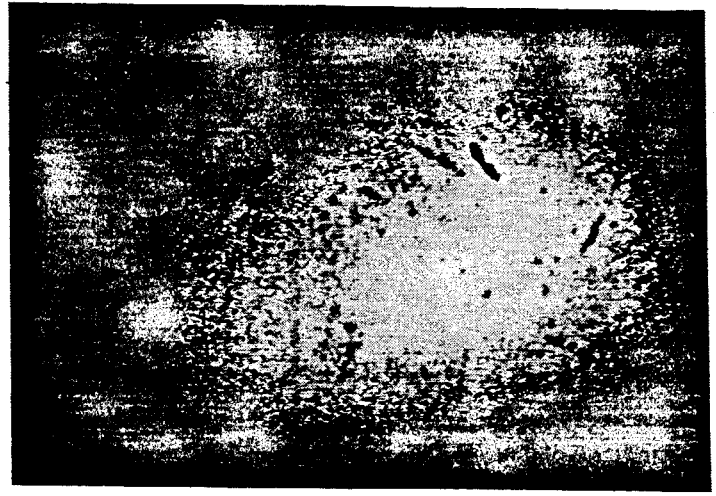
FIG. 2(b) is a photograph showing the cathodoluminescence image resulting from the wafer produced by the comparative example 1.
Figure 2C:
FIG. 2(c) is a microscope photograph showing the cathodoluminescence image resulting from the wafer produced by the comparative example 2.

FIGS. 1(a) to 1(d) show respective distributions of resistivities across the wafer of the respective wafers. FIGS. 2(a) to 2(c) show microscope photographs of the cathodoluminescence image obtained by a scanning electron microscope with a 200 magnification. FIG. 1(a) corresponds to the first embodiment, FIG. 1(b) corresponds to the second embodiment, FIG. 1(c) corresponds to the comparative example 1, and FIG. 1(d) corresponds to the comparative example 2. Also FIG. 2(a), FIG. 2(b) and FIG. 2(c) respectively correspond to the first embodiment, the comparative example 1, and the comparative example 2. The cathodoluminescence image resulting from the second embodiment was almost identical with that of the first embodiment.

According to the above Table, FIGS. 1(a) to 1(d) and FIG. 2(a) and FIG. 2(c), the wafers produced by the first and second embodiments are possessed of superior properties; i.e., less variations in their resistivity and mobility, less microscopic defect density revealed by AB etchant and uniform cathodoluminescence image in comparison with the wafers by the comparative examples. Further, FETs employing the wafers produced by the first and second embodiments indicate remarkably less variations in threshold voltage, Vth, in comparison with the comparative examples. These FETs are possessed of extraordinarily stable properties.

In addition to the above embodiments, the wafers prepared by the following process can provide the similar effect that the wafer's cathodoluminescence image is uniform as the above embodiments.

The wafers installed in an evacuated quartz ampoule are subjected to a first annealing step at temperatures higher than 1100° C. and lower than its melting point for at least 30 minutes, and then cooled down to room temperature at a cooling rate of from 1° to 30° C./min. The cooled wafers were etched and cleaned. At a second annealing step, the wafers are subjected to a heat-treatment at temperatures ranging from 750° C. to 1100° C. for at least 20 minutes in the quartz ampoule filled with a non-oxidizing gas atmosphere. After the second annealing, the wafers are cooled down to room temperature.

According to the explanation provided above, the method for producing the compound semiconductor single crystal substrates according to the above embodiments comprises the following steps; the wafers of a grown compound semiconductor single crystal are installed in an evacuated and sealed quartz ampoule and subjected to the first annealing step at the predetermined temperature for the predetermined period; then the wafers are gradually cooled down to room temperature at the predetermined cooling rate; the cooled wafers are subjected to etching; the etched wafers are subjected to the second annealing step at the predetermined temperature and for the predetermined period in a non-oxidizing atmosphere. This method can produce the wafers possessing a uniform cathodoluminescence image and less microscopic defects revealed by AB etchant, which are adapted for the substrates of electronic devices. The thus produced devices are possessed of extremely stable properties, and this will cause an improvement of the yield in its manufacturing process.

The first annealing is preferably carried out at temperatures higher than 1100° C. and lower than the melting point for at least 30 minutes. The cooling rate after the first annealing step is preferably from 1° to 30° C./min. The second annealing is preferably carried out at temperatures between 750° C. and 1100° C. for at least 20 minutes, most preferably at temperatures ranging from 900° C. to 1000° C. for at least 1 hour.

In the third embodiment of the present invention, the wafers to be used in this producing method are cut from a single crystal which is grown by a pulling-up technique, in which the single crystal is grown by applying the vapor pressure of a high dissociation pressure element put into an inner container set in a high pressure chamber, and whose microscopic defect density revealed by AB etchant is less than $2 \times 10^5$ cm$^{-2}$. Thus produced wafers installed in an evacuated quartz ampoule are subjected to the first annealing step at the predetermined temperature for the predetermined period. Then the wafers are gradually cooled down to room temperature at the predetermined cooling rate, and the cooled wafers are subjected to etching. The etched wafer is further subjected to the second annealing step at the predetermined temperature and for the predetermined period in a non-oxidizing atmosphere. This method can produce the wafers possessing a uniform cathodoluminescence image and less microscopic defects revealed by AB etchant, which are adapted for the substrates of electronic devices. Thus the devices using these wafers can be possessed of further stable properties.

As many apparently widely different embodiments of this invention may be made without departing from the spirit and scope thereof, it is to be understood that the invention is not limited to the specific embodiments thereof except as defined in the appended claims.

What is claimed is:

1. A method for producing compound semiconductor single crystal substrates comprising:
   a first annealing step including installing wafers of a grown compound semiconductor single crystal into an evacuated and sealed quartz ampoule and subjecting the wafers to a first heat-treatment at a temperature higher than 1100° C. and lower than the melting point of the single crystal for at least 30 minutes;
   a first cooling step, for gradually cooling the heat-treated wafers to room temperature at a cooling rate from 1° to 30° C./min;
   etching the cooled wafers;
   a second annealing step including subjecting the etched wafers to a second heat-treatment at temperatures between 750° C. and 1100° C. for at least 20 minutes in a non-oxidizing atmosphere; and
   a second cooling step, for cooling the heat-treated wafers gradually to room temperature.

2. The method according to claim 1, including cutting from a single crystal grown by a pulling-up technique, said single crystal being grown by applying the vapor pressure of a high dissociation pressure element put into an inner container set in a high pressure chamber, and whose microscopic defect density revealed by AB etchant is less than $2 \times 10^5$ cm$^{-2}$.

3. The method of claim 2, wherein said wafers are GaAs single crystal wafers.

4. The method according to claim 1, including carrying out said annealing step in a non-oxidizing atmosphere such as nitrogen gas, hydrogen gas, $AsH_3$ gas, inert gas, Ar gas, or a vacuum.

5. The method of claim 1 wherein said compound is selected from the group consisting of group III-V compounds.

6. The method of claim 1 wherein the second annealing step is carried out at a temperature between 900° C. and 1000° C.

7. The method of claim 1 wherein the second annealing is run for at least 1 hour.

8. The method of claim 1 wherein said heated quartz ampoule is supplied with arsenic gas up to an arsenic pressure of 1 atm at 1150° C.

9. The method according to claim 1, wherein said etching step includes installing said wafers into a container containing an etchant, said container being made of Teflon, quartz, or a commercially produced etching apparatus; and including carrying out the etching treatment for 20 minutes by moving said wafers in the container to apply the etching treatment to etch both surfaces of each of said wafers to remove soils attached on their surfaces that are formed by cutting work.

10. The method of claim 9 wherein said etchant is essentially composed of NaOH 25 g, $H_2O_2$ 100 cc, and $H_2O$ 2000 cc.

11. The method of claim 9 wherein said etchant is essentially composed of $H_2SO:H_2O_2:H_2O$, having a volume ratio from 1:1:1 to 10:1:1.

12. The method of claim 9 wherein said etchant is essentially composed of $HCl:H_2O_2:H_2O$, having a volume ratio from 1:1:1 to 10:1:1.

13. The method of claim 9 wherein said etchant is essentially composed of $Br_2$:methanol with a volume ratio of $Br_2$ of from 0.5 to 10%.

14. The method of claim 9 wherein said etchant is essentially composed of $H_3PO_4:H_2O_2:H_2O$, having a volume ratio from 1:1:1 to 10:1:1.

15. The method of claim 9 wherein said etchant is essentially composed of $NH_4OH:H_2O_2:H_2O$, having a volume ratio from 1:1:1 to 10:1:1.

16. The method of claim 9, including cleaning said wafers four times with water for five minutes in a supersonic cleaning machine and dried by blowing with $N_2$ gas at room temperature.

17. The method of claim 9 wherein said etching treatment is used to remove arsenic deposited on said wafer and to remove soils attached on the wafer surfaces.

18. The method of claim 1, wherein said compound is selected from the group consisting of group III-V compounds and said etchant is selected from the group consisting of NaOH 25 g, $H_2O_2$ 100 cc, and $H_2O$ 2000 cc; $H_2SO_4:H_2O_2:H_2O$, volume ratio from 1:1:1 to 10:1:1; $HCl:H_2O_2:H_2O$, volume ratio from 1:1:1 to 10:1:1; $Br_2$:methanol, volume ratio of $Br_2$ is from 0.5 to 10%; $H_3PO_4:H_2O_2:H_2O$, volume ratio from 1:1:1 to 10:1:1; $NH_4OH:H_2O_2:H_2O$, volume ratio from 1:1:1 to 10:1:1.

19. A method for producing Group III-V compound semiconductor single crystal substrates having a uniform cathodoluminescent image, comprising the steps of installing wafers of a grown compound semiconductor single crystal in an evacuated sealed quartz ampoule;

subjecting the wafers to a first annealing at a temperature higher than 1100° C. and lower than the melting point of the single crystal for at least 30 minutes;

cooling the wafers to room temperature at a cooling rate of from 1° to 30° C./min;

etching both surfaces of the wafers;

subjecting the wafers to a second annealing at temperatures from 750° C. to 1100° C. for at least 20 minutes in a non-oxidizing atmosphere; and cooling the wafers gradually to room temperature.

* * * * *